(12) United States Patent
Shih et al.

(10) Patent No.: US 9,130,017 B2
(45) Date of Patent: Sep. 8, 2015

(54) METHODS FOR FORMING INTERCONNECT STRUCTURES OF INTEGRATED CIRCUITS

(75) Inventors: Po-Cheng Shih, Hsin-Chu (TW); Chung-Chi Ko, Nantou (TW); Keng-Chu Lin, Ping-Tung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 959 days.

(21) Appl. No.: 13/220,245

(22) Filed: Aug. 29, 2011

(65) Prior Publication Data

US 2013/0052818 A1 Feb. 28, 2013

(51) Int. Cl.
*H01L 21/44* (2006.01)
*H01L 21/768* (2006.01)
*H01L 21/311* (2006.01)
*H01L 21/02* (2006.01)

(52) U.S. Cl.
CPC .... *H01L 21/76811* (2013.01); *H01L 21/31144* (2013.01); *H01L 21/76813* (2013.01); *H01L 21/02167* (2013.01); *H01L 21/02271* (2013.01)

(58) Field of Classification Search
CPC ................... H01L 21/76804; H01L 21/76807; H01L 21/76808; H01L 21/7681; H01L 21/76811; H01L 21/76813; H01L 21/76814; H01L 21/76831; H01L 21/76877; H01L 21/76879; H01L 21/76897; H01L 21/31144; H01L 21/02271; H01L 21/02167
See application file for complete search history.

(56) References Cited

U.S. PATENT DOCUMENTS

| 2003/0038334 | A1* | 2/2003 | Kim et al. ...................... 257/499 |
| 2007/0034517 | A1* | 2/2007 | Tsao et al. ...................... 205/118 |
| 2010/0304555 | A1* | 12/2010 | Kaneko et al. ................. 438/585 |
| 2012/0264306 | A1* | 10/2012 | Wu et al. ........................ 438/702 |

\* cited by examiner

*Primary Examiner* — Calvin Choi
(74) *Attorney, Agent, or Firm* — Slater & Matsil, L.L.P.

(57) ABSTRACT

A method includes forming a hard mask over a low-k dielectric layer, and patterning the hard mask to form an opening. A stress tuning layer is formed over the low-k dielectric layer and in physical contact with the hard mask. The stress tuning layer has an inherent stress, wherein the inherent stress is a near-zero stress or a tensile stress. The low-k dielectric layer is etched to form a trench aligned to the opening, wherein the step of etching is performed using the hard mask as an etching mask.

19 Claims, 12 Drawing Sheets

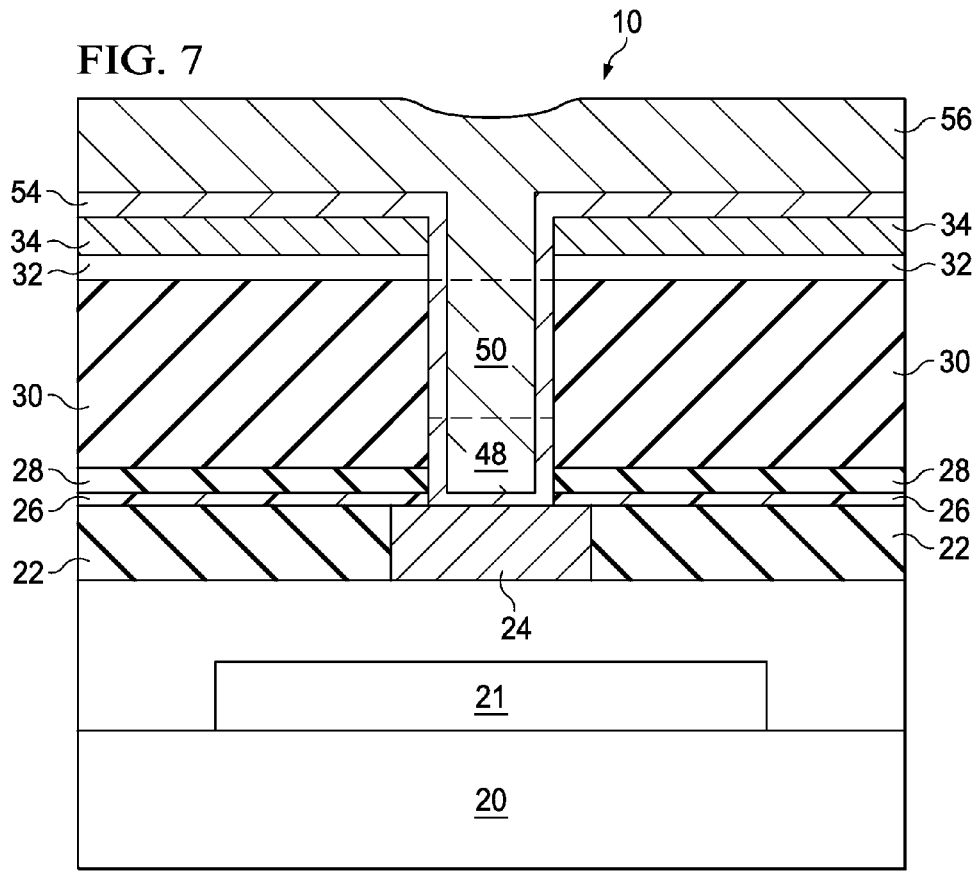
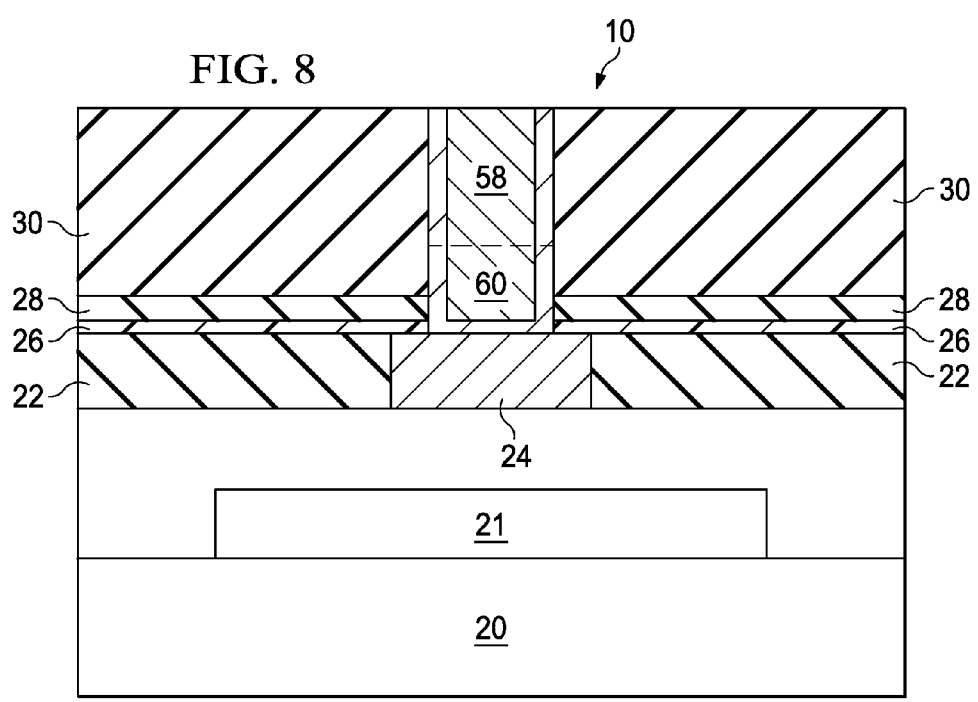

METHODS FOR FORMING INTERCONNECT STRUCTURES OF INTEGRATED CIRCUITS

BACKGROUND

Integrated circuit devices such as transistors are formed over semiconductor wafers. The devices are interconnected through metal lines and vias to form functional circuits, wherein the metal lines and vias are formed in back-end-of-line processes. To reduce the parasitic capacitance of the metal lines and vias, the metal lines and vias are formed in low-k dielectric layers, which typically have k values lower than 3.8, lower than 3.0, or lower than 2.5.

In the formation of the metal lines and vias, the low-k dielectric material is etched to form trenches and via openings. The etching of the low-k dielectric material may involve forming a metal hard mask and a silicon carbide layer over the low-k dielectric material, and using the patterned metal hard mask as an etching mask to form trenches. Via openings are also formed and self aligned to the trenches. The trenches and the via openings are then filled with a metallic material, which may comprise copper. A chemical mechanical polish (CMP) is then performed to remove excess portions of the metallic material over the low-k dielectric material.

It has been found that when the widths of the low-k dielectric lines become very small, for example, when the respective circuits are formed using 28 nm technology or 20 nm technology, line bending may occur to low-k dielectric lines that are in neighboring trenches. Since the metallic material is filled into the trenches and via openings, the bending of the low-k dielectric lines causes the distortion of the resulting metal lines, and sometimes the breaking of the metal lines and vias.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 8 are cross-sectional views of intermediate stages in the manufacturing of a metal line and a via in a low-k dielectric layer in accordance with various embodiments, wherein a stress tuning layer is formed underlying a metal hard mask.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of forming metal lines and vias using a metal hard mask scheme is provided in accordance with various embodiments. The intermediate stages of forming the metal lines and vias are illustrated. The variations of the embodiments are discussed. Throughout the various views and illustrative embodiments, like reference numbers are used to designate like elements.

Figure 1:
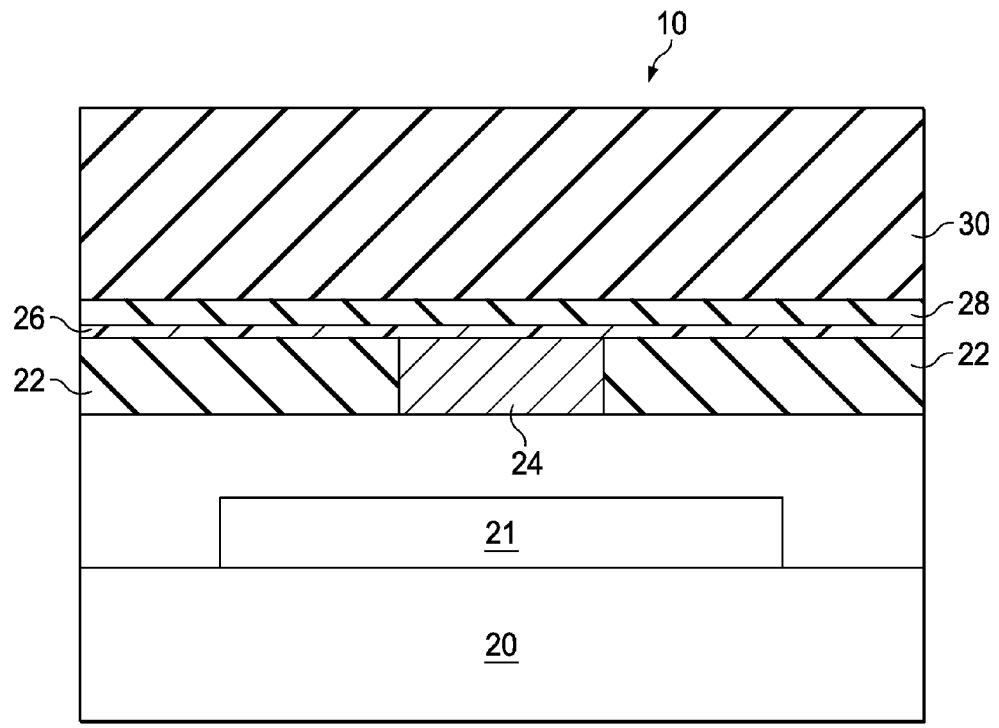

Referring to FIG. 1, wafer 10, which includes substrate 20 and overlying layers, is provided. Substrate 20 may be formed of a commonly used semiconductor material such as silicon, silicon germanium, or the like, and may be a bulk substrate or a semiconductor-on-insulator (SOI) substrate. Integrated circuit devices 21 such as transistors are formed at a surface of substrate 20. Dielectric layer 22 is formed over substrate 20. In an embodiment, dielectric layer 22 is a low-k dielectric layer, for example, having a dielectric constant (k value) lower than about 3.0. Metal feature 24 is formed in dielectric layer 22. In some embodiments, metal feature 24 is formed of copper or a copper alloy, although it may also comprise other conductive materials such as tungsten, aluminum, or the like.

Etch stop layer 26 is formed over dielectric layer 22 and metal feature 24. Etch stop layer 26 may be formed of silicon carbide, silicon nitride, or the like. Dielectric layer 28 may be optionally formed over etch stop layer 26. The optional dielectric layer 28 may be formed of, for example, tetraethoxysilane (TEOS) oxide. Dielectric layer 30 is formed over dielectric layer 28. Dielectric layer 30 may be formed of a low-k dielectric material that has a k value lower than about 3.0, or lower than about 2.5, for example. Accordingly, throughout the description, dielectric layer 30 is alternatively referred to as low-k dielectric layer 30. Low-k dielectric layer 30 may be formed of a porous or a non-porous low-k dielectric material. In an embodiment, low-k dielectric layer 30 has a high modulus, for example, greater than about 8 MPa. The modulus may also be between about 8 MPa and about 14 MPa. With low-k dielectric layer 30 having a high modulus, the line bending of low-k dielectric lines and the resulting metal lines may be reduced, wherein the low-k dielectric lines are portions of low-k dielectric layer 30 that are separated by trenches in low-k dielectric layer 30.

Figure 2:
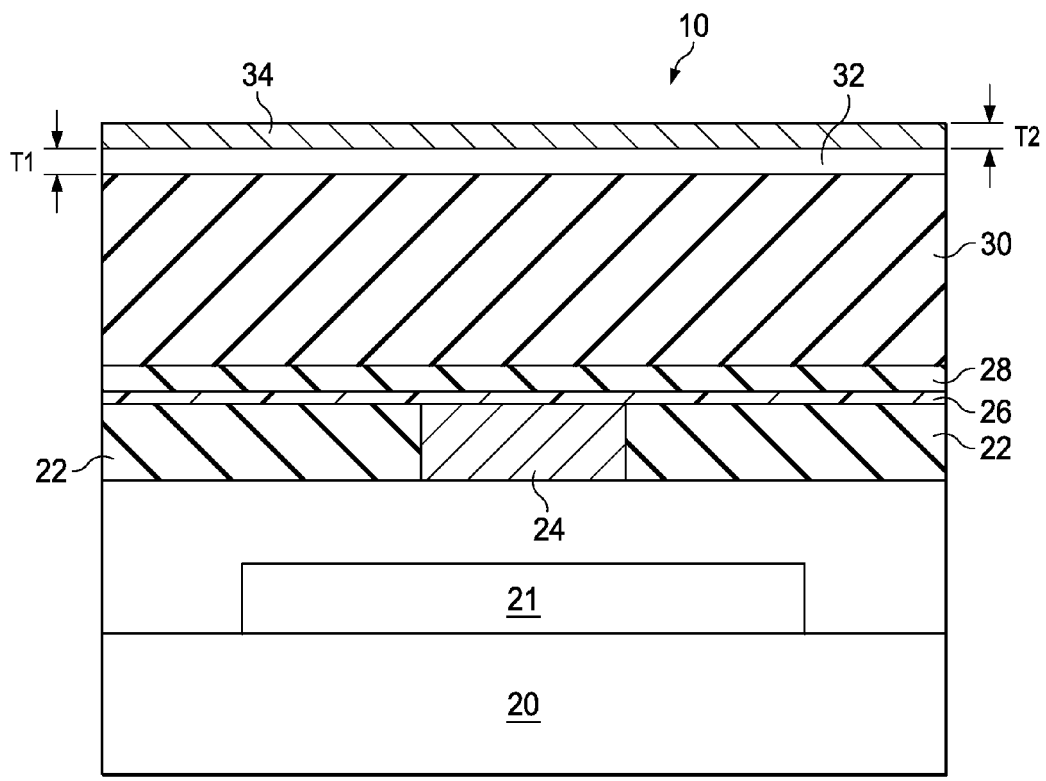

Referring to FIG. 2, stress tuning layer 32 is formed over low-k dielectric layer 30. In an embodiment, stress tuning layer 32 is formed of silicon carbide. Alternatively, stress tuning layer 32 may comprise (or may be formed of) silicon nitride, silicon oxide, an oxynitride, or the like. Stress tuning layer 32 may have thickness T1 between about 100 Å and 300 Å, for example, although a greater or a smaller thickness may be used. Stress tuning layer 32 may have an inherent stress close to the zero stress (neutral stress), or have a tensile stress. In an embodiment, the inherent stress of stress tuning layer 32 is greater than about −50 MPa, and maybe between about −50 MPa and about 300 MPa, wherein negative stresses are compressive stresses, and positive stresses are tensile stresses. To achieve these stresses, the process conditions for forming stress tuning layer 32 may be tuned. In an exemplary embodiment, to form stress tuning layer 32 that comprises silicon carbide and having the stress between about −50 MPa and about 300 MPa, the process conditions include a wafer temperature between about 300° C. and about 400° C., a flow rate of 4-methyl silane (4MS) between about 200 sccm and about 1,000 sccm, and a flow rate of $NH_3$ between about 200 sccm and about 1,000 sccm.

Hard mask 34 is formed over, and may be in physical contact with, stress tuning layer 32. Hard mask 34 may be a metal hard mask formed of titanium, titanium nitride, tantalum, tantalum nitride, boron nitride, and combinations thereof. Accordingly, hard mask 34 is alternatively referred to as metal hard mask 34 hereinafter. Metal hard mask 34 may also be formed of a composite layer, which may comprise a tantalum layer and a tantalum nitride layer on the tantalum layer, for example. Thickness T2 of metal hard mask 34 may be between about 300 Å and about 400 Å. Thickness T1 of stress tuning layer 32 may be comparable to thickness T2, for example, with thickness T1 greater than about one fourth, or greater than a half, thickness T2. Thickness T1 may also be equal to or greater than thickness T2, and may be smaller than about 1.5 times thickness T2.

Metal hard mask 34 may have an inherent compressive stress, for example, between about −0.8 GPa and about −1.2 GPa. Since stress tuning layer 32 has the inherent stress that is significantly more tensile than the inherent stress of metal hard mask 34, the highly compressive stress of metal hard mask 34 is partially balanced, and stress tuning layer 32 and metal hard mask 34 in combination apply a stress much smaller than the stress applied if no stress tuning layer 32 is formed. The adverse effect, such as the line bending of low-k dielectric layer 30, which is caused by the high compressive stress of metal hard mask 34, is significantly reduced.

Figure 3:
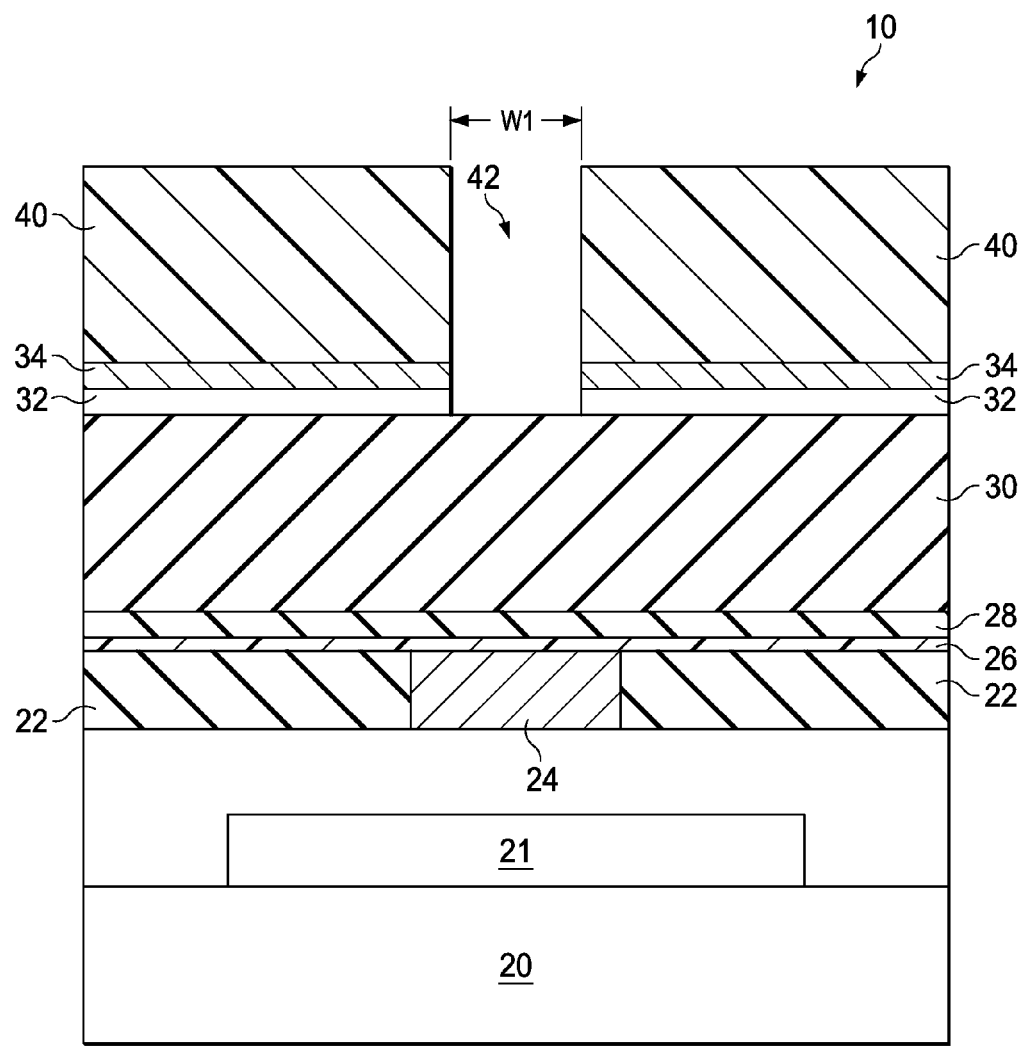
Figure 4:
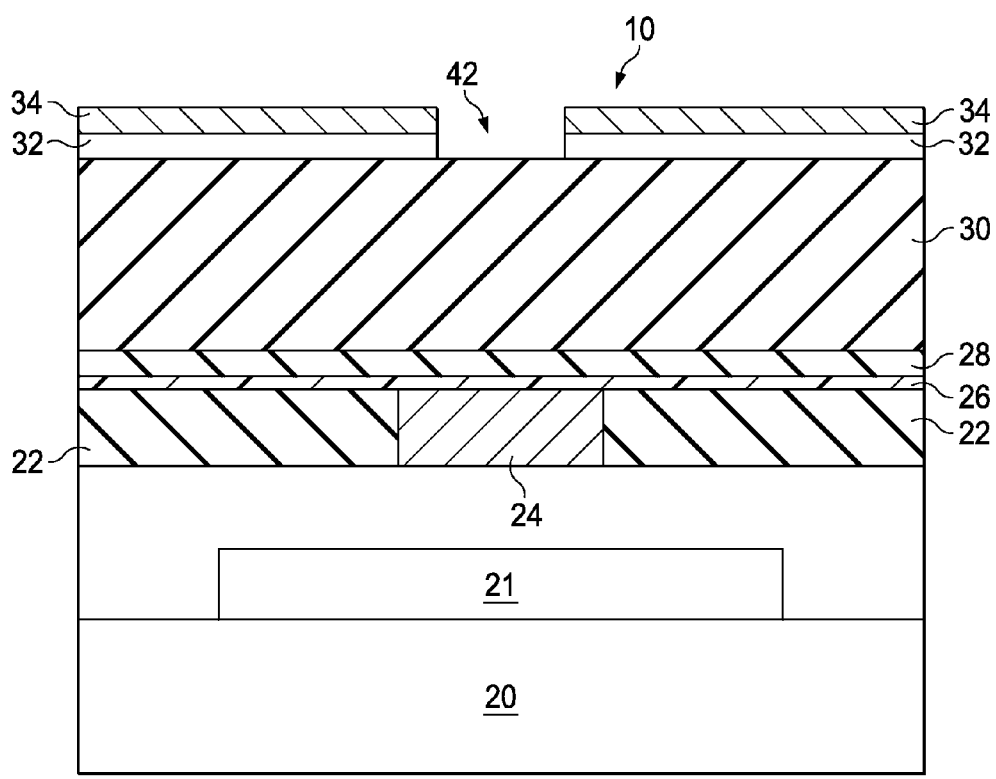

Referring to FIG. 3, photo resist 40 is formed and patterned. The patterned photo resist 40 is then used as an etching mask to etch metal hard mask 34 and stress tuning layer 32, and the etching may stop on, or over, the top surface of low-k dielectric layer 30. Opening 42 is thus formed in metal hard mask 34 and stress tuning layer 32. In a top view (not shown) of the structure shown in FIG. 3, opening 42 may have a strip shape with length L1 (not shown in FIG. 3, please refer to FIG. 6B) greater than width W1 (FIG. 3). Next, as shown in FIG. 4, photo resist 40 is removed, for example, in an ashing step.

Figure 5:
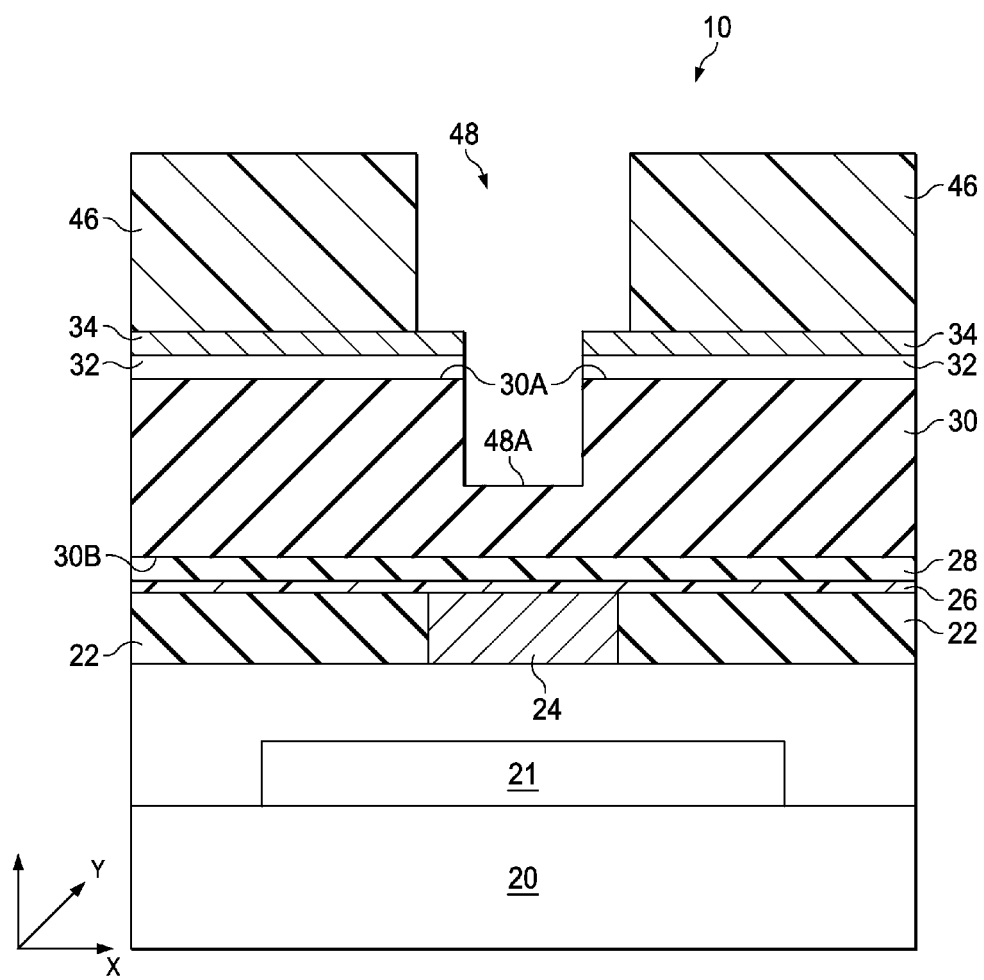

Referring to FIG. 5, photo resist 46 is formed and patterned, and via opening 48 is formed by etching into low-k dielectric layer 30 using photo resist 46 as an etching mask. Bottom surface 48A of via opening 48 is at an intermediate level between top surface 30A and bottom surface 30B of low-k dielectric layer 30. The etching is self aligned in the X direction since metal hard mask 34 limits the size and the position of via opening 48 in the X direction, wherein the X direction is parallel to the illustrated plane. In the Y direction that is perpendicular to the illustrated plane, photo resist 46 defines the size and the position of via opening 48.

Figure 6A:
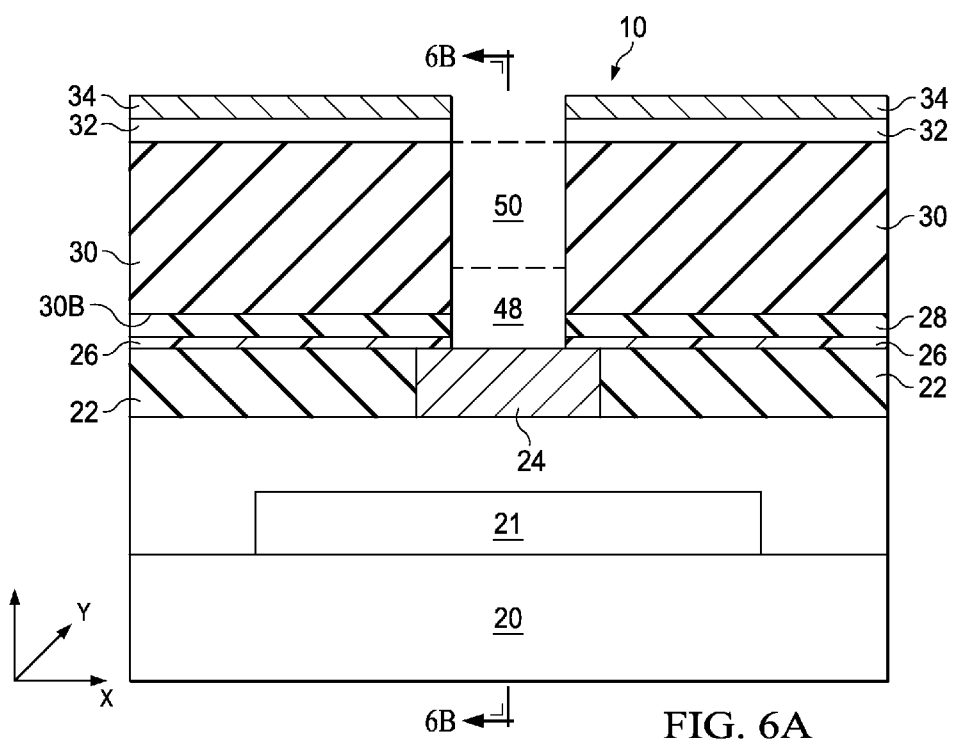
Figure 6B:
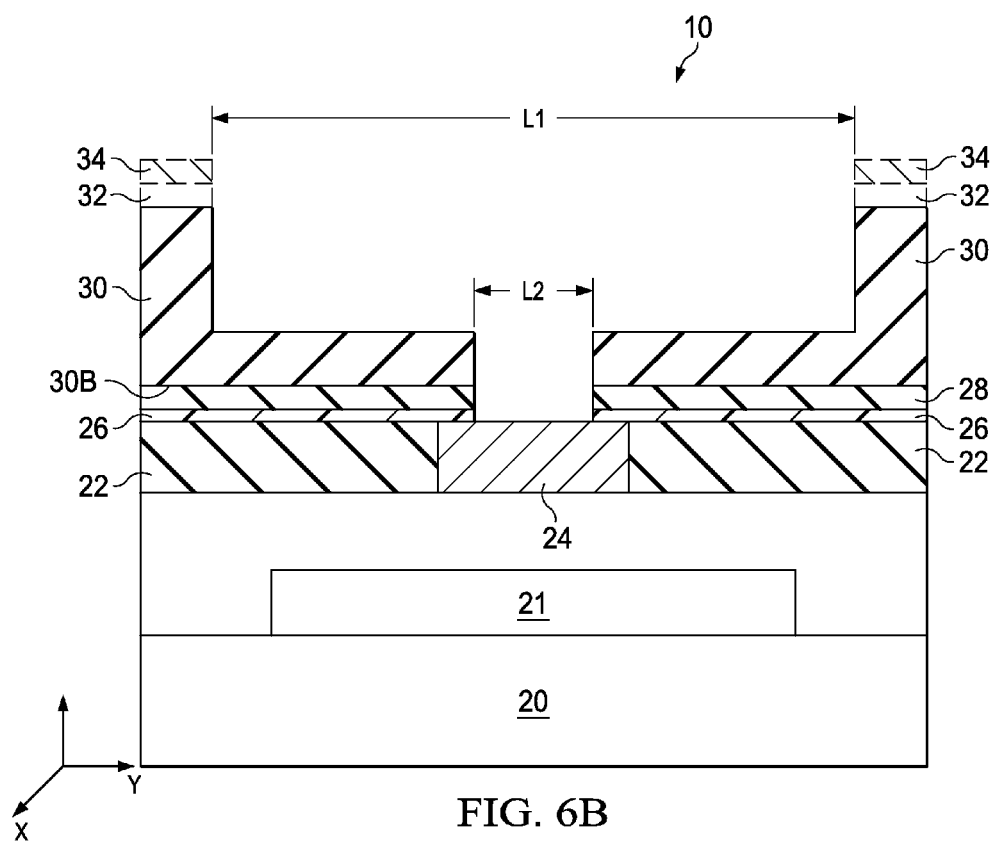

FIGS. 6A and 6B illustrate the removal of photo resist 46, the formation of trench 50, and the extension of via opening 48. First, photo resist 46 is removed, and metal hard mask 34 may be exposed. Next, an etching is performed to etch low-k dielectric layer 30, so that trench 50 is formed. The etching may be an anisotropic etching. During the etching, metal hard mask 34 is used as the etching mask so that the pattern of trench 50 is similar to the pattern of opening 42 (FIG. 3) of metal hard mask 34. Trench 50 is also substantially vertically aligned to opening 42. At the same time trench 50 is formed, via opening 48 extends downwardly, until via opening 48 extends to bottom surface 30B of low-k dielectric layer 30, and oxide layer 28 and etch stop layer 26 are also etched, until metal feature 24 is exposed. FIG. 6B illustrates a cross-sectional view of the structure shown in FIG. 6A, wherein the cross-sectional view is taken along a plane crossing line 6B-6B in FIG. 6A. In FIG. 6B, stress tuning layer 32 and metal hard mask 34 are illustrated using dashed lines since they are not in the illustrated plane. Trench 50 has length L1, which is greater than length L2 of via opening 48.

Referring to FIG. 7, diffusion barrier layer 54 and metallic material 56 are filled into trench 50 and via opening 48. Diffusion barrier layer 54 may be formed of titanium, titanium nitride, tantalum, tantalum nitride, or combinations thereof. Metallic material 56 may be formed of pure copper, substantially pure copper, or copper alloys. Metallic material 56 may be filled to a level higher than the top surface of metal hard mask 34.

Next, as shown in FIG. 8, a planarization such as a chemical mechanical polish (CMP) is performed, and the excess portions of metallic material 56 and diffusion barrier layer 54 that are over low-k dielectric layer 30 are removed. Metal hard mask 34 and stress tuning layer 32 may also be removed in the CMP. In the resulting structure, the portions of diffusion barrier layer 54 and metallic material 56 remaining in trench 50 and via opening 48 form metal line 58 and via 60, respectively.

Figure 9:
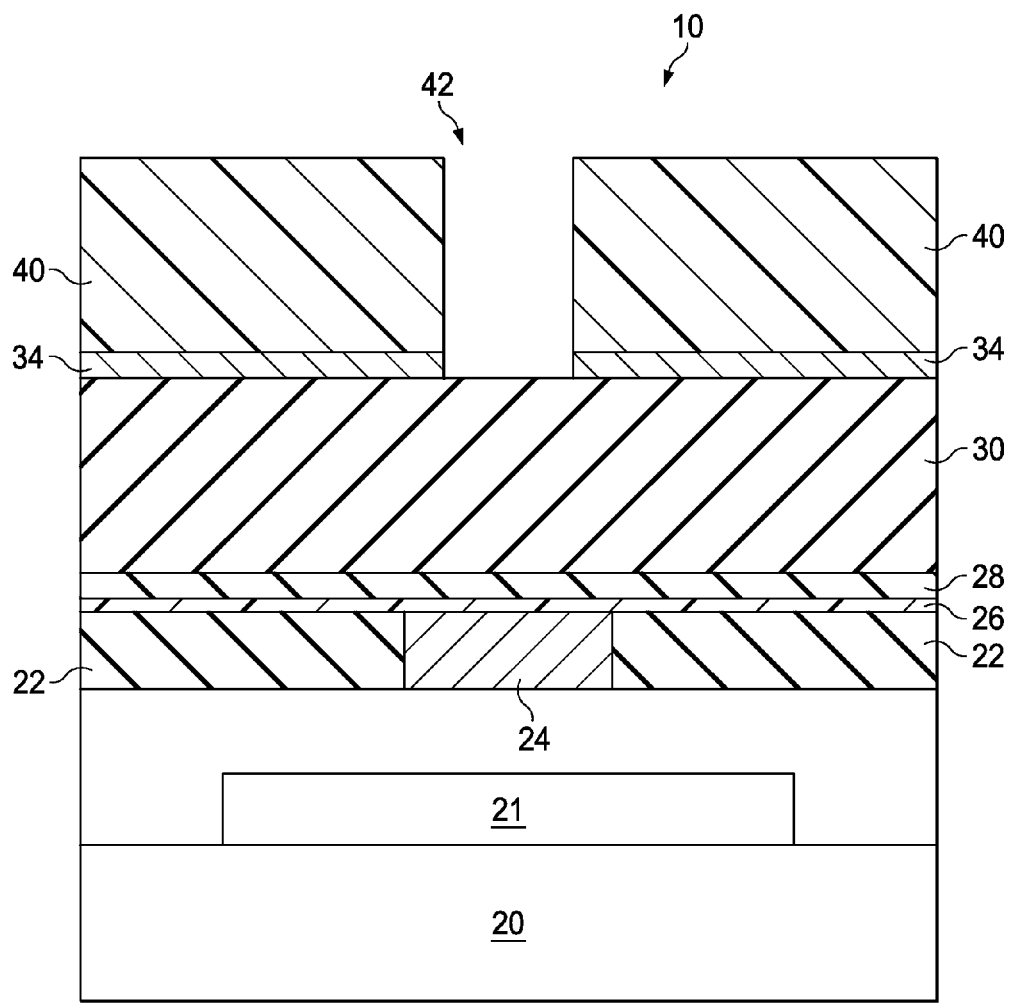
FIGS. 9 through 14 are cross-sectional views of intermediate stages in the manufacturing of a metal line and a via in a low-k dielectric layer in accordance with various alternative embodiments, wherein a stress tuning layer is formed overlying a metal hard mask.

FIGS. 9 through 14 illustrate the cross-sectional views in the formation of metal lines and vias in accordance with alternative embodiments. Unless specified otherwise, the reference numerals in these embodiments represent like elements in the embodiments illustrated in FIGS. 1 through 8. Accordingly, the formation methods, materials, and dimensions of the features in these embodiments may be essentially the same as that of the like features in the embodiments in FIGS. 1 through 8. The initial structure is essentially the same as shown in FIG. 1. Next, as shown in FIG. 9, metal hard mask 34 is formed, followed by the formation and the patterning of photo resist 40. Metal hard mask 34 is then etched to form opening 42, and photo resist 40 is removed.

Figure 10:
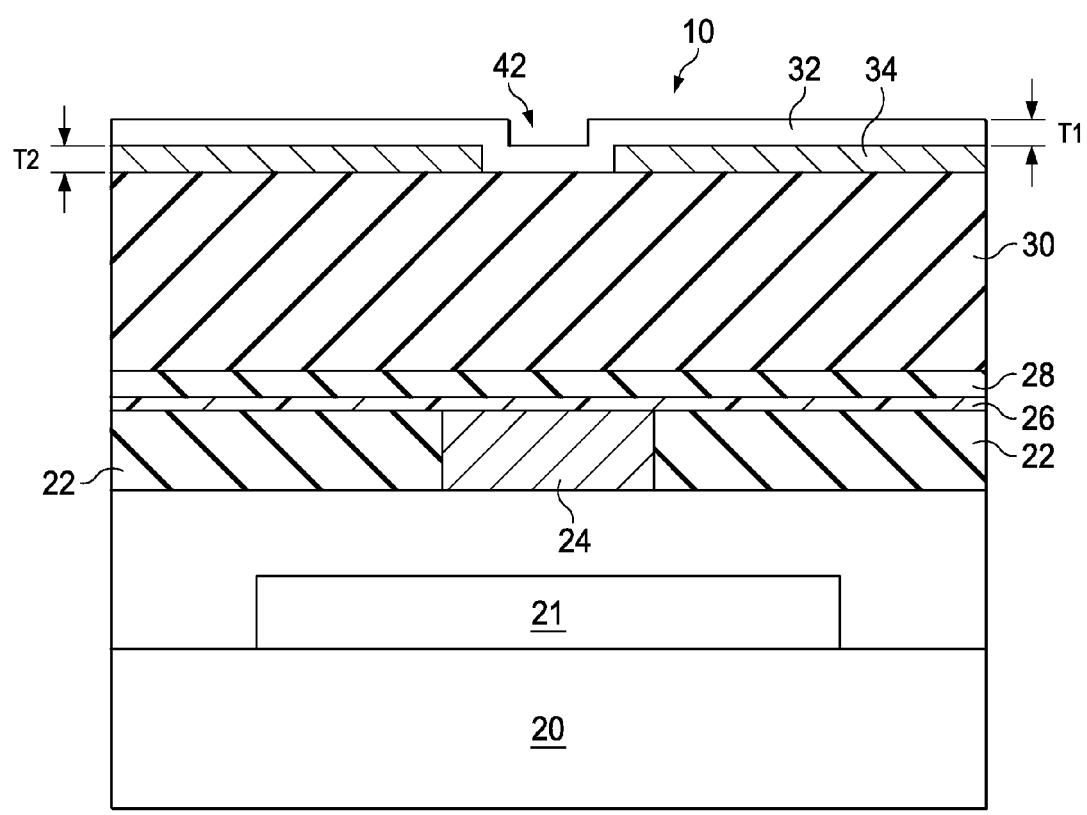

Referring to FIG. 10, stress tuning layer 32 is formed over, and may be in physical contact with, metal hard mask 34. Stress tuning layer 32 further extends into opening 42, and may, or may not, contact low-k dielectric layer 30 in some embodiments. Similar to the embodiments in FIGS. 1 through 8, stress tuning layer 32 may have an inherent stress close to zero stress, or have a tensile stress. In an embodiment, the inherent stress of stress tuning layer 32 is greater than about −50 MPa, and maybe between about −50 MPa and about 300 MPa. In addition, thickness T2 of metal hard mask 34 may be between about 300 Å and about 400 Å. Thickness T1 of stress tuning layer 32 may be comparable to thickness T2 of metal hard mask 34, for example, with thickness T1 greater than about one fourth, or greater than a half, thickness T2. Thickness T1 may also be equal to or greater than thickness T2, and may be smaller than about 1.5 times thickness T2.

Figure 11:
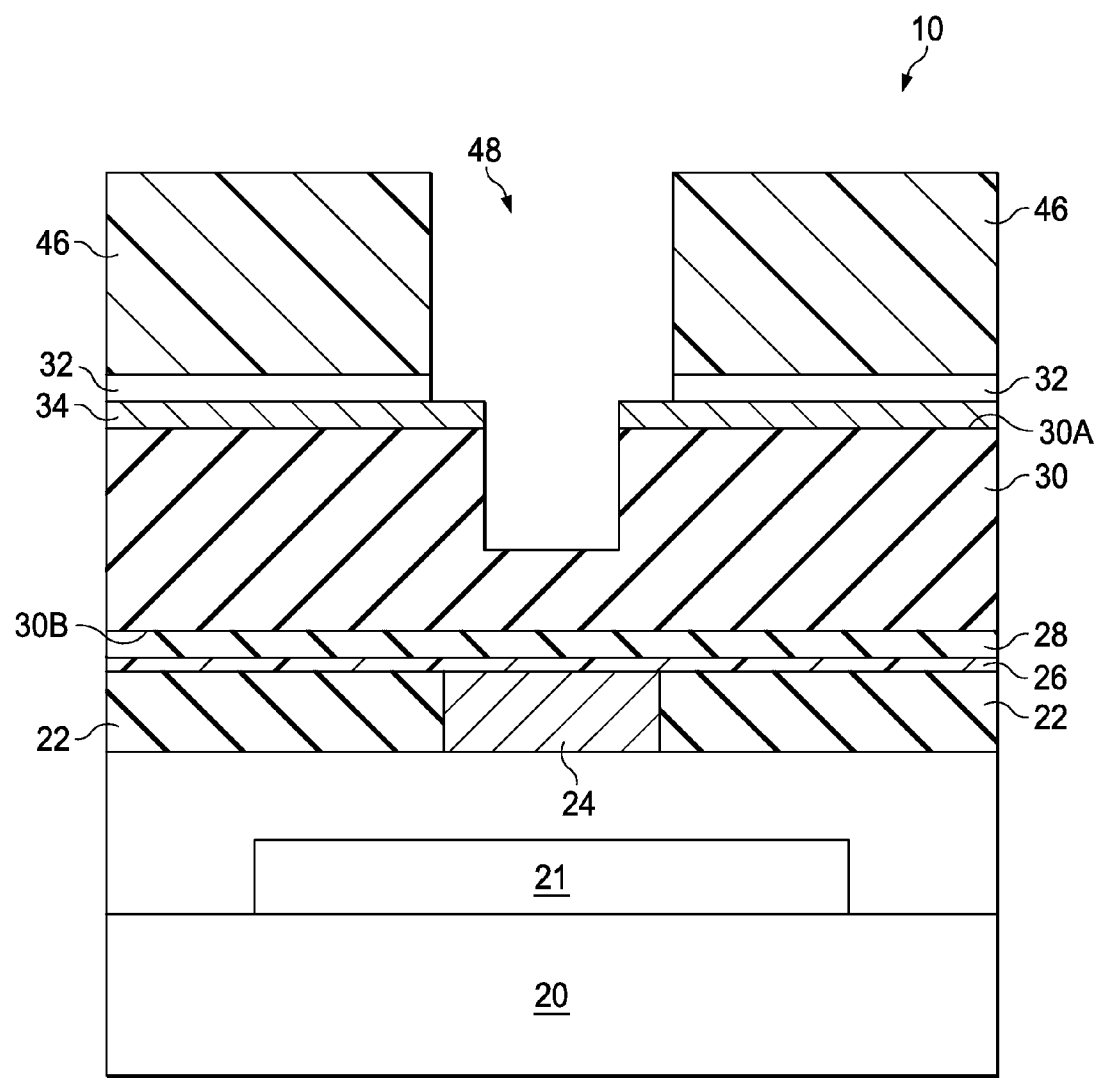
Figure 12:
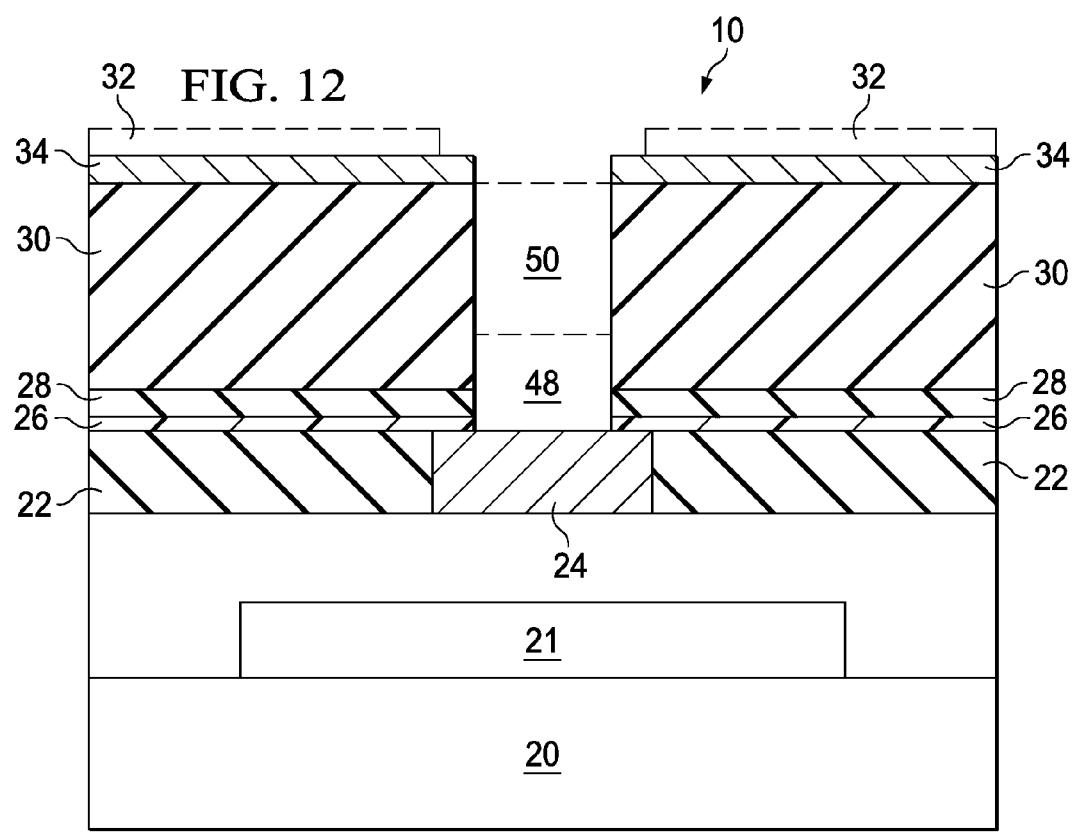
Figure 13:
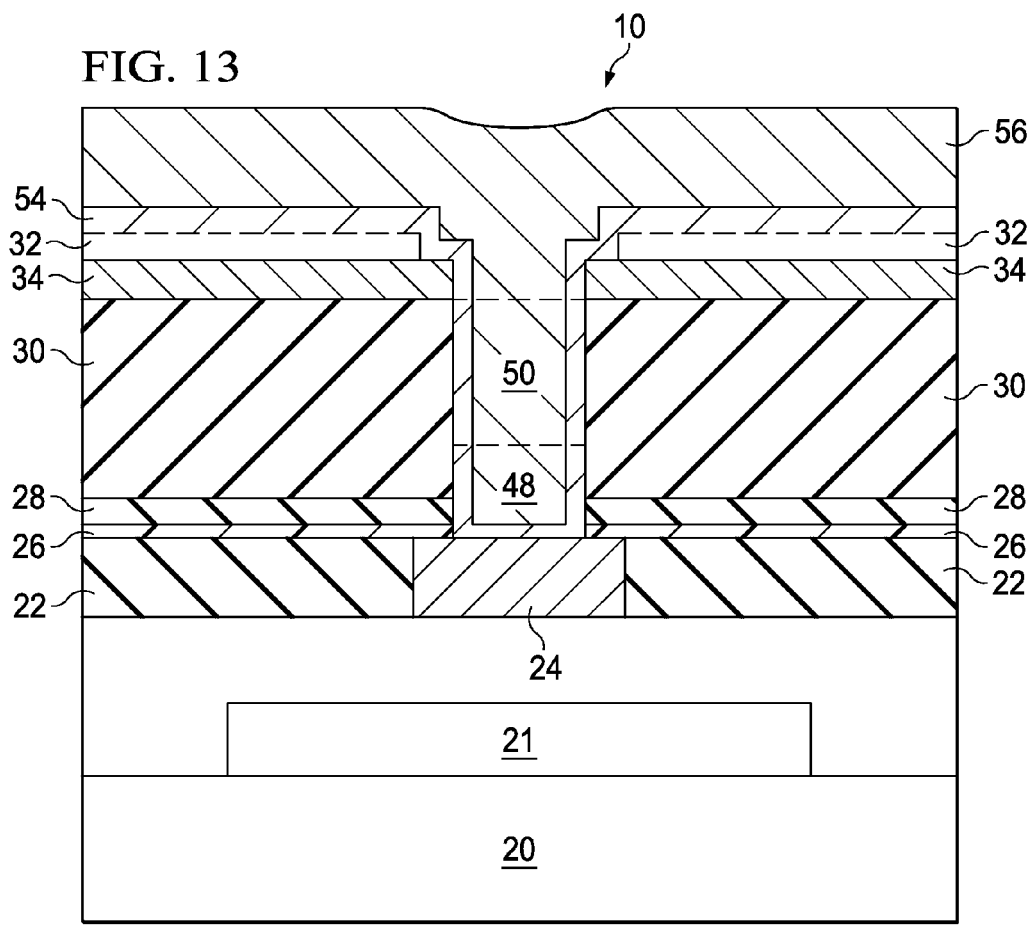
Figure 14:
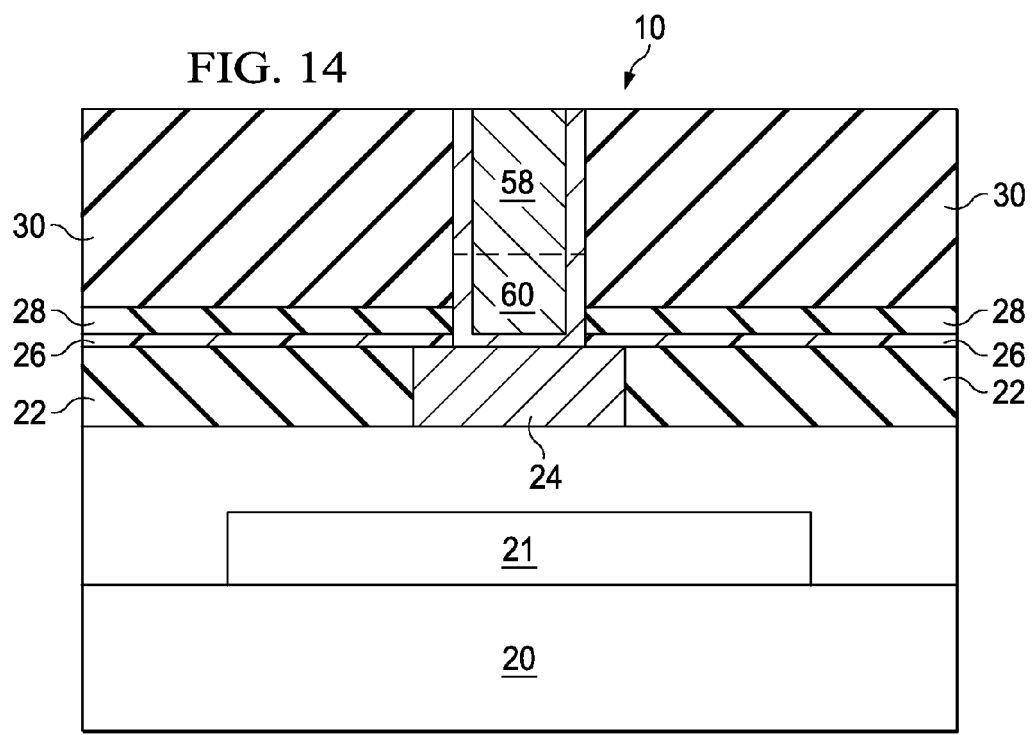

Next, in FIG. 11, photo resist 46 is formed and patterned, and via opening 48 is formed by etching stress tuning layer 32 and low-k dielectric layer 30, wherein via opening 48 stops at an intermediate level between top surface 30A and bottom surface 30B of low-k dielectric layer 30. The formation of via opening 48 is self aligned. In FIG. 12, photo resist 46 is removed. In an embodiment, stress tuning layer 32 and metal hard mask 34 are used as hard masks to form trench 50, and to extend via opening 48 down to metal feature 24. Accordingly, the respective etchant for etching low-k dielectric layer 30 is selected to attack low-k dielectric layer 30, and not to attack stress tuning layer 32 and metal hard mask 34. In alternative embodiments, metal hard mask 34 is used to form trench 50, and to extend via opening 48 down to metal feature 24. Accordingly, the respective etchant is selected to attack low-k dielectric layer 30 and stress tuning layer 32, and not to attack metal hard mask 34. In subsequent steps as shown in FIG. 13, diffusion barrier layer 54 and metallic material 56 are filled into trench 50 and via opening 48, followed by a CMP to form metal line 58 and via 60, respectively. FIG. 14 illustrates a resulting structure.

By using the embodiments, during the formation of trench 50 and via opening 48 (FIGS. 6A, 6B, and 12), and also during the step of filling trench 50 and via opening 48 with metallic materials, stress tuning layer 32 partially balances the high compressive stress of metal hard mask 34, and hence the line bending of the low-k dielectric lines in low-k dielectric layer 30 is reduced, and the line bending of metal lines 58 (FIGS. 8 and 14) is also reduced. Experiments have been performed to form sample wafers comprising low-k dielectric layers. In the sample wafers, parallel trenches that are closely located are formed in a low-k dielectric layer. Accordingly, the low-k dielectric material between neighboring trenches forms low-k dielectric lines. In first sample wafers wherein no stress tuning layer is formed, it was found that neighboring low-k dielectric lines are bended, and merge together. In second sample wafers wherein stress tuning layers having inherent stresses equal to about 100 MPa or about 200 MPa are formed, no bending in low-k dielectric lines was found.

In accordance with embodiments, a method includes forming a metal hard mask over a low-k dielectric layer, and patterning the metal hard mask to form an opening. A stress tuning layer is formed over the low-k dielectric layer and in physical contact with the metal hard mask. The stress tuning layer has an inherent stress, wherein the inherent stress is a near-zero stress or a tensile stress. The low-k dielectric layer is etched to form a trench aligned to the opening, wherein the step of etching is performed using the metal hard mask as an etching mask.

In accordance with other embodiments, a method includes forming a low-k dielectric layer over a metal feature, and forming a stress tuning layer over the low-k dielectric layer. The stress tuning layer has an inherent stress greater than about −50 MPa. A metal hard mask is formed over and in physical contact with the stress tuning layer, wherein the metal hard mask has an inherent compressive stress. The metal hard mask and the stress tuning layer are patterned using a same mask to form an opening in the metal hard mask and the stress tuning layer. The low-k dielectric layer is etched to form a via opening in the low-k dielectric layer. The low-k dielectric layer is etched to form a trench, wherein the trench is vertically aligned to the opening in the metal hard mask. A metal line and a via are formed in the trench and the via opening, respectively, wherein the metal line and the via are electrically coupled to the metal feature.

In accordance with yet other embodiments, a method includes forming a low-k dielectric layer over a metal feature, and forming a metal hard mask over the low-k dielectric layer, wherein the metal hard mask has an inherent compressive stress. The metal hard mask is patterned to form an opening in the metal hard mask. A stress tuning layer is formed over, and in physical contact with, the metal hard mask, wherein the stress tuning layer includes a portion extending into the opening in the metal hard mask. The stress tuning layer has an inherent stress greater than about −50 MPa. The portion of the stress tuning layer in the opening and the low-k dielectric layer are etched to form a via opening in the low-k dielectric layer. The low-k dielectric layer is etched to form a trench, wherein the trench is vertically aligned to the opening in the metal hard mask. A metal line and a via are formed in the trench and the via opening, respectively, wherein the metal line and the via are electrically coupled to the metal feature.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a hard mask over a low-k dielectric layer;
   patterning the hard mask to form an opening;
   after the patterning the hard mask, forming a stress tuning layer, wherein the stress tuning layer comprises a first portion overlying and in physical contact with the hard mask, and a second portion extending into the opening, with a bottom of the second portion of the stress tuning layer substantially coplanar with a bottom surface of the hard mask, wherein the stress tuning layer has an inherent stress, and wherein the inherent stress is a near-zero stress or a tensile stress; and
   etching the low-k dielectric layer to form a trench aligned to the opening, wherein the step of etching is performed using the hard mask as an etching mask.

2. The method of claim 1, wherein the stress tuning layer has a first thickness greater than about one fourth of a second thickness of the hard mask.

3. The method of claim 1, wherein the inherent stress of the stress tuning layer is a tensile stress.

4. The method of claim 1, wherein the inherent stress of the stress tuning layer is between about −50 MPa and about 300 MPa.

5. The method of claim 1, wherein the stress tuning layer comprises silicon carbide, silicon nitride, silicon oxide, or an oxynitride.

6. The method of claim 1 further comprising:
   forming a via opening in the low-k dielectric layer, wherein the via opening is underlying the trench;
   forming a diffusion barrier layer in the trench and the via opening;
   filling a metallic material in the trench and the via opening, wherein the metallic material is over the diffusion barrier layer; and
   performing a chemical mechanical polish (CMP) to remove excess portions of the metallic material over the low-k dielectric layer, wherein the hard mask and a remaining portion of the stress tuning layer are removed during the CMP.

7. A method comprising:
   forming a low-k dielectric layer over a metal feature;
   forming a hard mask over the low-k dielectric layer, wherein the hard mask has an inherent compressive stress;
   patterning the hard mask to form an opening in the hard mask;
   forming a stress tuning layer over, and in physical contact with, the hard mask, wherein the stress tuning layer comprises a portion extending into the opening in the hard mask;
   etching the portion of the stress tuning layer in the opening and etching the low-k dielectric layer to form a via opening in the low-k dielectric layer;
   etching the low-k dielectric layer to form a trench, wherein the trench is vertically aligned to the opening in the hard mask; and
   forming a metal line and a via in the trench and the via opening, respectively, wherein the metal line and the via are electrically coupled to the metal feature.

8. The method of claim 7, further comprising removing an entirety of the portion of the stress tuning layer extending into the opening of the hard mask.

9. The method of claim 7, wherein the inherent stress of the stress tuning layer is a tensile stress.

10. The method of claim 7, wherein the stress tuning layer comprises silicon carbide, and wherein the hard mask comprises a material selected from the group consisting essentially of titanium, titanium nitride, tantalum, tantalum nitride, boron nitride, and combinations thereof.

11. The method of claim 7, wherein the stress tuning layer further comprises a portion directly over the hard mask, wherein the portion of the stress tuning layer extending into the opening of the hard mask comprises a bottom surface in contact with a top surface of the low-k dielectric layer.

12. The method of claim 7, wherein the step of forming the metal line and the via comprises:
  filling a diffusion barrier layer into the trench and the via opening;
  filling a metallic material over the diffusion barrier layer and in the trench and the via opening; and
  performing a chemical mechanical polish (CMP) to remove excess portions of the metallic material over the low-k dielectric layer, wherein the hard mask and a remaining portion of the stress tuning layer are removed during the CMP.

13. A method comprising:
forming a low-k dielectric layer;
forming a hard mask over the low-k dielectric layer, wherein the hard mask comprises a material selected from the group consisting essentially of titanium, titanium nitride, tantalum, tantalum nitride, boron nitride, and combinations thereof, and the hard mask has a first inherent stress of a first stress type;
etching the hard mask to form a trench in the hard mask;
forming a stress tuning layer comprising a portion over the hard mask, wherein the stress tuning layer has a second stress of a second stress type opposite to the first stress type, wherein the stress tuning layer further extends into the trench in the hard mask and contacts the low-k dielectric layer, and a bottom surface of a portion of the stress tuning layer in the trench is substantially planar with a bottom of the hard mask;
etching the low-k dielectric layer to form a via opening;
etching the low-k dielectric layer to extend the trench into the low-k dielectric layer, with the via opening extending deeper into the low-k dielectric layer, wherein the via opening is underlying the trench; and
forming a metal line and a via in the trench and the via opening, respectively.

14. The method of claim 13, wherein the second stress is a tensile stress in a range between 0 MPa and about 300 MPa.

15. The method of claim 13, wherein the forming the metal line and the via comprises:
  filling a diffusion barrier layer and a metallic material into the trench and the via opening; and
  performing a chemical mechanical polish (CMP) to remove excess portions of the metallic material and the diffusion barrier over hard mask.

16. The method of claim 15, wherein after the CMP, the stress tuning layer has a portion remaining over the hard mask.

17. The method of claim 15, wherein after the CMP, the stress tuning layer is removed from over the hard mask.

18. The method of claim 1, wherein the stress tuning layer and the hard mask comprise different elements.

19. The method of claim 13, wherein the stress tuning layer and the hard mask comprise different elements.

\* \* \* \* \*